United States Patent [19]

Gravrok et al.

[11] Patent Number: 5,111,074
[45] Date of Patent: May 5, 1992

[54] MULTI-INPUT COMPOUND FUNCTION COMPLEMENTARY NOISE-IMMUNE LOGIC

[75] Inventors: Roger J. Gravrok, Eau Claire, Wis.; Raymond M. Warner, Jr., Edina, Minn.

[73] Assignee: Regents of the University of Minnesota, St. Paul, Minn.

[21] Appl. No.: 559,162

[22] Filed: Jul. 26, 1990

[51] Int. Cl.⁵ .................. H03K 17/16; H03K 19/086; H03K 19/003; H03K 17/30
[52] U.S. Cl. .................................. 307/443; 307/455; 307/446; 307/241; 307/242; 307/518
[58] Field of Search ............... 307/443, 454, 455, 456, 307/518, 241, 542, 448, 446, 242.8; 340/825.5

[56] References Cited

U.S. PATENT DOCUMENTS

| | | | |
|---|---|---|---|
| 3,824,409 | 7/1974 | Patil | 307/241 X |
| 4,609,834 | 9/1986 | Gal | 307/455 X |
| 4,613,771 | 9/1986 | Gal | 307/455 X |
| 4,853,561 | 8/1989 | Gravrok | 307/443 |
| 4,868,904 | 9/1989 | Gravrok | 307/443 |

Primary Examiner—Edward P. Westin
Assistant Examiner—David R. Bertelson
Attorney, Agent, or Firm—Kinney & Lange

[57] ABSTRACT

A digital logic circuit having multiple inputs and a product-of-sums output uses multi input OR circuits with interacting constant-current and constant-voltage elements to improve voltage transfer characteristics. A second-level arbitration circuit connects to the OR circuits and provides mutually exclusive pull-up and pull-down control signals as a logical function of the states of the OR circuits. An output stage connects to the arbitration circuit. The output stage comprises pull-up and pull-down drivers responsive to the output of the second-level arbitration circuit. The digital logic circuit operates at high speed because its transistors are prevented from entering saturation. The logic circuit is easily expandable and provides a simple and direct method of implementing logic circuits which provide product-of-sums outputs.

19 Claims, 5 Drawing Sheets

MULTI-INPUT COMPOUND FUNCTION COMPLEMENTARY NOISE-IMMUNE LOGIC

BACKGROUND OF THE INVENTION

The present invention relates to digital logic circuits. In particular, the present invention relates to a multi-input, compound function noise-immune logic circuit.

In the field of integrated circuit design, Emitter-Coupled Logic (ECL) and Complementary Metal-Oxide-Semiconductor logic (CMOS) are the most popular logic families used at present.

ECL offers high-speed operation but large systems are difficult to design successfully using ECL because of its large power dissipation, limited logic functionality, and poor noise immunity, which can compromise the operational reliability of the overall system.

By comparison, CMOS consumes less power but yields somewhat lower speeds than ECL. Because of the highly interconnected and redundant nature of fully complementary static CMOS logic designs, CMOS integrated circuits are frequently implemented with dynamic-CMOS logic-gate design techniques that inherently trade off operational reliability in an attempt to circumvent the somewhat restricted logic functionality of the CMOS logic family.

Prior-art logic families suffer from sacrificed operational reliability, limited logic functionality, and nonuniform propagation delays within each logic family. These nonuniform delays make it virtually impossible to design a large-scale system that does not have to be redesigned because of critical-speed paths that fail to meet their timing windows, and thereby cause the system to malfunction.

U.S. Pat. Nos. 4,853,561 and 4,868,904 for Noise-Immune Logic (NIL) and Complementary Noise-Immune Logic (CNIL), respectively, teach the use of interacting constant-voltage and constant-current elements in digital logic gates.

SUMMARY OF THE INVENTION

The present invention uses a circuit design concept that improves the performance and reliability of digital logic gates used in integrated circuits. The present invention is a novel logic-family design that delivers substantial improvements in logic-family operational reliability and logic-gate functionality.

The invention provides a useful, new combination of the Complementary Noise-Immune Logic (CNIL) design principles and new features to realize entire new families of high-reliability logic gates. These gates feature an improvement in logic functionality because of their increased number of logic inputs and their new ability to implement compound-function product-of-sums logical operations in a single high-speed circuit. The CNIL principles of interacting constant-voltage and constant- current elements have never before been used as described herein to realize multiple-input logic gates. This invention improves CNIL and uses it to implement powerful logic gates that perform complex logical operations involving many input variables. Because this invention uses the CNIL logic design principles, the resulting gates maintain their desirable near-ideal logic performance and reliability advantages.

The specific turn-on voltage of the constant-voltage element helps determine the logic-transition voltage of the digital circuit. The constant-current element permits a second variable voltage drop to develop within the logic gate while simultaneously regulating the amount of current within the gate.

The present invention is a useful new combination of circuit design techniques that yields a novel family of digital logic gates delivering unprecedented levels of reliability, speed, and logic functionality. This is not a modified ECL or a bipolar version of CMOS. The input portion of the present invention uses novel configurations of circuits that independently regulate voltage and current levels thereby permitting the design of arbitrarily large noise margins and logic swings. The voltage and current regulating circuits are not strictly a series connection of circuit elements that regulate a signal flowing between the input node and the control electrode of a driver transistor. In response to a changing input signal these circuits interact to define the logic-transition point where the constant-voltage portion of the circuit turns on. Following that, the constant-current portion of the circuit regulates the amount of current that the constant-voltage element will conduct. Again the constant-voltage portion of the circuit permits the input voltage to travel through a first voltage range to yield one noise margin for one logic level and the constant-current regulation permits a second variable voltage drop to develop for the other noise margin. The control signal that is received by the driver transistors in the present invention is merely a function of the conduction state of these regulating elements.

In preferred embodiments of the present invention, a combination constant-current/constant-voltage circuit is connected to a multi-input active circuit. The multi-input active circuits provide a first level of logical arbitration (e.g., an OR of the inputs. The multi-input active circuits and the constant-voltage/constant-current circuit comprise a first-level OR subcircuit. A second-level of logical arbitration is accomplished by the AND subcircuit. This logically ANDs together the results of the OR subcircuits and passes the compound result onto the push-pull driver circuit. The AND result may be passed on as a single-ended signal, or as mutually exclusive signals. It is the combination of the CNIL principles that are used in the first-level OR subcircuits, which are ANDed together in the second-level arbitration circuit and sent on to the push-pull driver, that comprise the highly reliable product-of-sum logic gate that is the present invention. For brevity, the embodiments of the present invention are described as implementing a positive-logic product-of-sums compound-function logic gate; however, it is understood that sum-of-products, and other variations are claimed as part of this invention. Although the preferred embodiments utilize bipolar junction transistors, it is clear that the concepts of the present invention may be implemented with other transistors, such as GaAs FETs. The invention also includes techniques that prevent transistors in the logic circuit from entering saturation.

BRIEF DESCRIPTION OF THE DRAWINGS

FIG. 3 is an electrical schematic diagram showing another embodiment of the present invention.

DETAILED DESCRIPTION OF THE PREFERRED EMBODIMENTS

Figure 1:
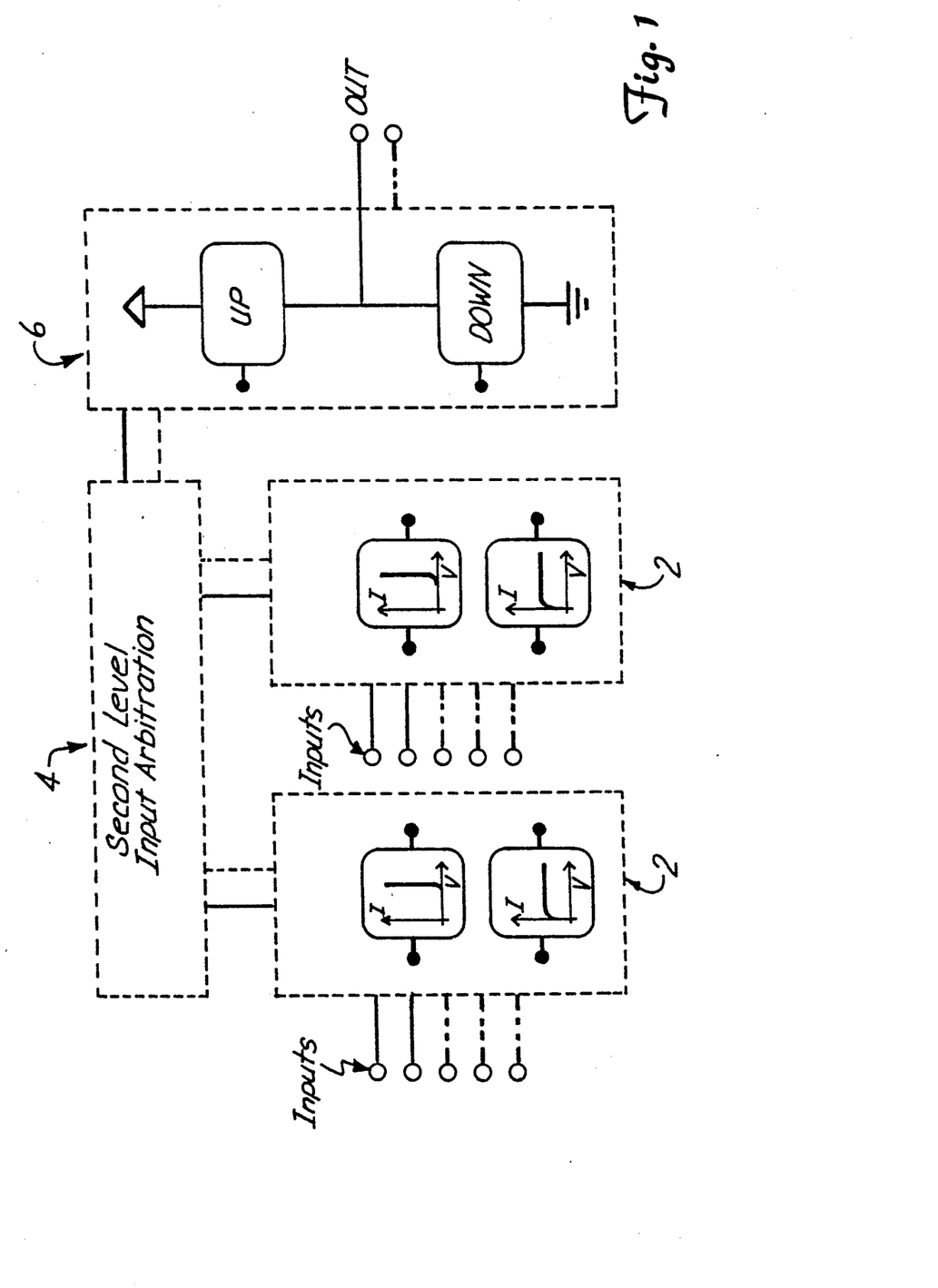
FIG. 1A is a block diagram of an electric circuit in accordance with the present invention.
FIG. 1B is an equivalent logic diagram.
Figure 1B:
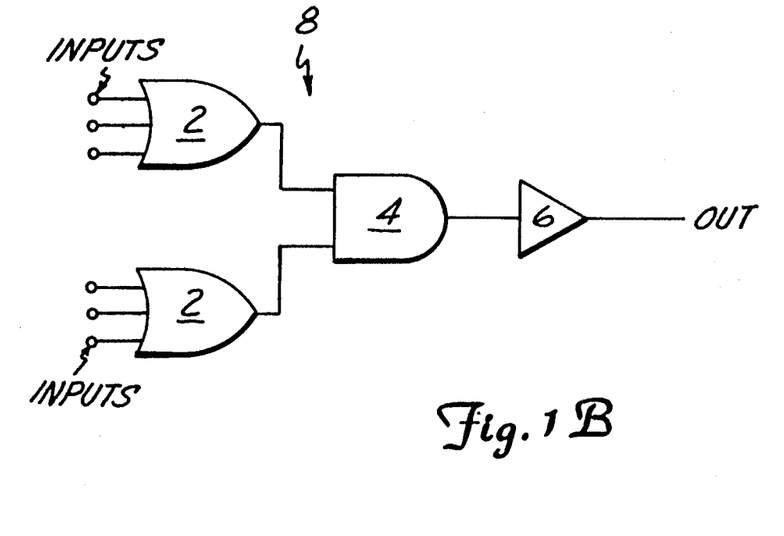

The present invention provides a multi-input, multi-function high-speed digital logic circuit with designable logic swing and noise margins. Broadly, the invention includes a multi-input active circuit with a constant-current/constant-voltage element, a second-level arbitration circuit and a push-pull output stage. FIG. IA is a block diagram of the present invention. Multi-input active circuit 2 connects to a second-level arbitration circuit 4. The symbols within the multi-input active circuit 2 indicate that the circuit uses constant-current and constant-voltage circuit elements. The dashed connection between each multi-input active circuit to a second-level arbitration circuit 4 indicates that the output of multi-input active circuit 2 may have a complementary output. The second-level arbitration circuit 4 is connected to a push-pull output stage 6. The push-pull output stage requires complementary signals for operation. The complementary signals may be provided by second-level arbitration circuit 4 to push-pull output stage 6, or may be provided internally within stage 6, as indicated by the dashed connection between second-level arbitration circuit 4 and push-pull output stage 6. The push-pull output stage 6 may provide a complementary output. FIG. 1B is a corresponding logic diagram 8. Three different embodiments of the present invention are explained below.

I. THE EMBODIMENT OF FIG. 2

Figure 2:
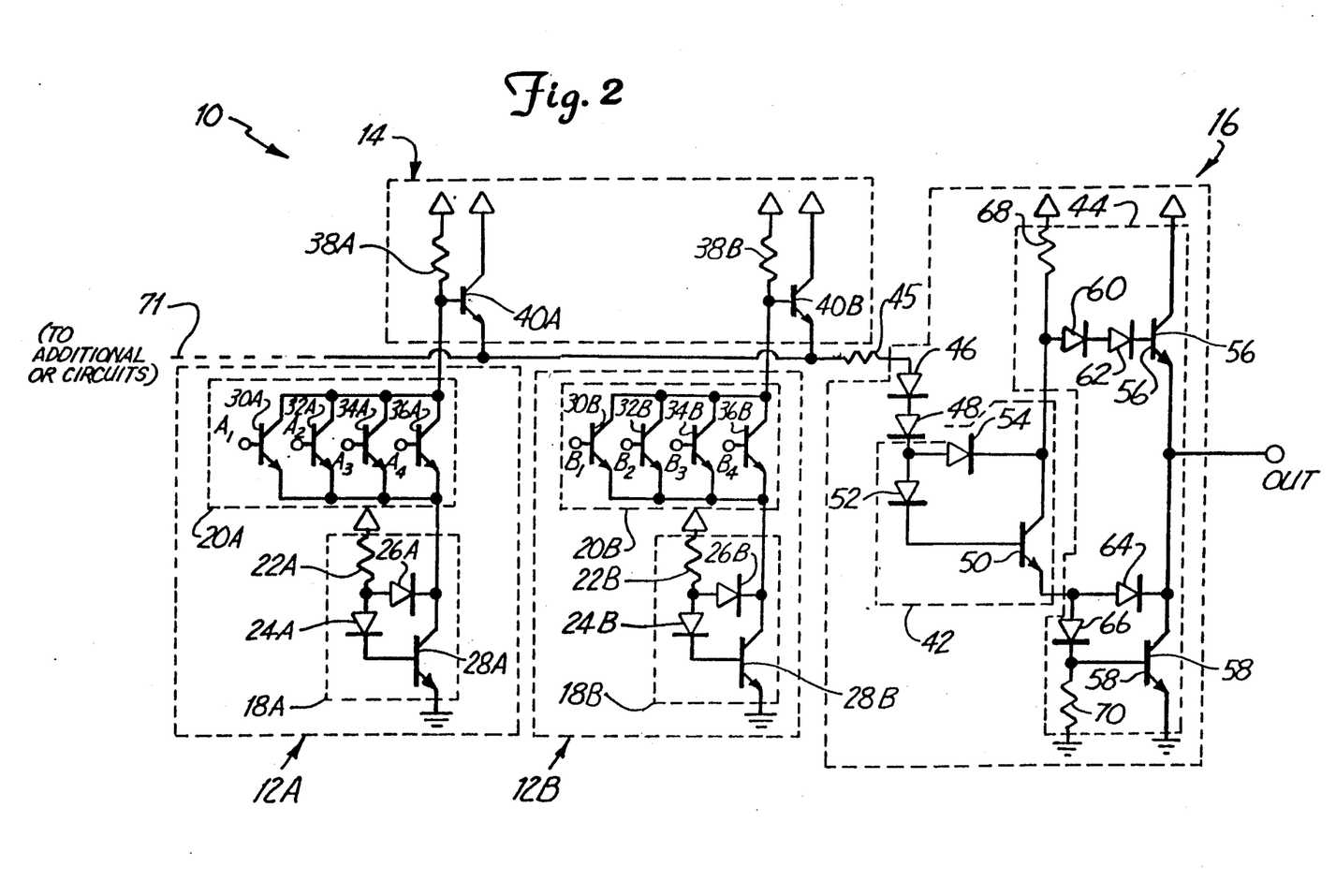
FIG. 2 is an electrical schematic diagram of digital logic circuit made in accordance with the present invention which produces a product-of-sums output.

FIG. 2 shows a product-of-sums circuit 10 in accordance with the present invention which produces an output OUT $=(A_1+A_2+A_3+A_4)\cdot(B_1+B_2+B_3+B_4)$, where $A_1$ through $A_4$ and $B_1$ through $B_4$ are inputs to circuit 10. Product-of-sums circuit 10 comprises multi-input OR circuits 12A and 12B, second-level arbitration circuit 14 and output circuit 16.

A. OR CIRCUITS 12A, 12B

For convenience, OR circuit 12A will be described in detail. However, OR circuit 12B contains similar components and operates in a similar manner. Comparable components in OR circuits 12A and 12B bear the same reference numeral, but the reference numeral is followed by the letter "A" in circuit 12A and the letter "B" in circuit 12B. OR circuit 12A includes a constant-current/constant-voltage circuit 18A and active input circuit 20A.

Constant-current/constant-voltage circuit 18A comprises resistor 22A, diodes 24A and 26A, and NPN bipolar junction transistor 28A. Resistor 22A is connected between a power supply voltage source and the anodes of diodes 24A and 26A. Diode 24A has its cathode connected to the base of transistor 28A. Diode 26A has its cathode connected to the collector of transistor 28A. The emitter of transistor 28A is connected to an electrical ground.

Diodes 24A and 26A form a negative-feedback clamping circuit that prevents transistor 28A from entering saturation. Consider the case where transistor 28A is to be switched on. Assume that initially $V_{CE}$ is several volts and there is no collector current. Current through resistor 22A will all flow through diode 0 24A into the base of transistor 28A, which causes $V_{CE}$ to drop. In this mode, the non-saturated transistor 28A will function normally and conduct collector current equal to the beta of transistor 28A times its base current. The voltage at the anodes of diodes 24A and 26A associated with transistor 28A will be approximately 1.4 Volts. Diode 26A will not conduct until $V_{CE}$ drops to about 0.7 Volts. At this point, transistor 28A is at the edge of entering saturation. Transistor 28A, however, will not enter saturation because if $V_{CE}$ drops below 0.7 Volts, diode 26A will conduct. This pulls down the voltage at the anodes of diodes 24A and 26A and, which redirects the current through resistor 22A from the base of transistor 28A to its collector.

This negative feedback ensures that when transistor 28A is conducting, it will not pull its own $V_{CE}$ below its $V_{BE}$. Thus, transistor 28A will not saturate.

The configuration of transistor 28A and diodes 24A and 26A provides a combination constant-current element and constant-voltage element. If additional diodes (not shown) are added in series with diode 24A, the turn-on voltage at the collector of transistor 28A can be shifted up. When constant-current/constant-voltage circuit 18A is turned on, $I_C$ of transistor 28A will remain approximately constant.

Active input circuit 20A comprises NPN bipolar junction transistors 30A, 32A, 34A and 36A connected in parallel at their collectors and emitters. The bases of transistors 30A-36A provide input connections for inputs $A_1$ through $A_4$ of product-of-sums circuit 10. The emitters of transistors 30A-36A are connected to the collector of transistor 28A of constant-current/constant-voltage circuit 18A.

B. SECOND-LEVEL ARBITRATION CIRCUIT 14

Second-level arbitration circuit 14 is connected to OR circuits 12A and 12B. Second-level arbitration circuit 14 comprises resistors 38A and 38B and bipolar junction transistors 40A and 40B. Each resistor 38A, 38B is connected to a power-supply voltage. The collector of each transistor 40A, 40B is connected to a power-supply voltage. The base of each transistor 40A, 40B is connected to resistor 38A, 38B, respectively. The bases of transistors 40A, 40B also connect to the corresponding OR circuit 12A, 12B at the collectors of transistors 30A-36A and 30B-36B, respectively.

C. OUTPUT CIRCUIT 16

Output circuit 16 comprises complementary drive circuit 42, push-pull output stage 44 and level shift diodes 46 and 48. Diodes 46 and 48 determine the output logic swing of the circuit. The number of diodes in series can be changed for the desired output swing.

Complementary drive circuit 42 comprises NPN bipolar junction transistor 50 and diodes 52 and 54. Diodes 52 and 54 clamp the base-collector junction of transistor 50. In the configuration of FIG. 2, second-level arbitration circuit 14 does not provide a complementary output, but the complementary signal to drive output circuit 16 is generated by complementary drive circuit 42. Transistor 50 is connected to OR circuits 12A, 12B through diodes 52 and 54, diodes 46 and 48, and resistor 45, and transistors 40A and 40B.

Push-pull output stage 44 comprises pull-up transistor 56, pull-down transistor 58, diodes 60, 62, 64 and 66 and resistors 68 and 70. Pull-up transistor 56 and pull-down transistor 58 comprise NPN bipolar junction transistors.

The collector of pull-up transistor 56 connects to the power-supply voltage. The base of pull-up transistor 56 is connected to a power-supply voltage through resistor 68 and diodes 60 and 62. The base of transistor 56 is also connected to the collector of transistor 50 of complementary drive circuit 42 through diodes 60 and 62. The emitter of pull-up transistor 56 is connected to the collector of pull-down transistor 58 and to output node OUT of product-of-sums circuit 10.

The emitter of pull-down transistor 58 is connected to electrical ground. The collector of pull-down transistor 58 is connected to the emitter of transistor 50 through diode 64. The base of pull-down transistor 58 is connected to the emitter of transistor 50 through diode 66 and to electrical ground through resistor 70.

Note that the pairs of clamping diodes (such as: 24A and 26A, 24B and 26B, 52 and 54, 66 and 64) may also be implemented with a single two-emitter collector-base shorted transistor.

D. OPERATION

The present invention provides a family of noise-immune logic gates with a high degree of logic functionality and design flexibility that operate at high speed. The operation of product-of-sums circuit 10 will be described with reference to a single OR circuit 12A.

When all logic inputs ($A_1$ through $A_4$) to the bases of transistors 30A–36A are low, transistors 30A–36A are turned off. Resistor 38A pulls up on the base of transistor 40A so that transistor 40A is turned on, as is transistor 50 of complementary drive circuit 42. As a result, pull-down transistor 58 is turned on to provide a logical low output of output node OUT. Because pull-down transistor 58 is clamped with diodes 64 and 66 to prevent saturation, the output low ($V_{OL}$) is about 0.8 Volts. Since transistor 50 is also clamped using diodes 52 and 54 (to prevent saturation as well as provide voltage regulation), its collector voltage is pulled down to about 2.25 Volts (assuming one diode drop is 0.75 Volts). This shuts off pull-up transistor 56 because there are only two diode drops of voltage (1.5 Volts) across the three-junction series path between the collector of 50 and the emitter of 56. This voltage-level regulation ensures that there is no totempole current flowing through pull-up transistor 56. Even though none of the transistors saturate, their turn-off speeds can be enhanced by including discharge resistors (not shown) across the base-emitter junctions of pull-up transistor 56 and transistor 50 in addition to resistor 70 on pull-down transistor 58.

When one of the inputs at the base of transistors 30A–36A is high (above 1.5 Volts), the gate switches state and the base of transistor 40A is pulled down. Because the constant-current/constant-voltage circuit 18A uses a single diode 24A in series with the base of transistor 28A, its specific turn-on voltage is about 0.75 Volts as measured at the collector of transistor 28A. This, in combination with $V_{BE}$ of the input transistors 30A–36A, results in an input transition voltage of about 1.5 Volts. The constant-voltage action of the constant-current/constant-voltage circuit 18A sets the input transition voltage and provides a designable noise margin for a logic low. The constant-current action of the constant-current/ constant-voltage circuit 18A permits an input node to be pulled up beyond the input transition which yields a large designable noise margin for a logic high.

The constant-current/constant-voltage circuit 18A will regulate the amount of current flowing through resistor 38A, which has been selected so that the IR voltage drop across resistor 38A brings the base of transistor 40A low enough to shut off transistor 50 of complementary drive circuit 42. This shuts off transistor 58 and also permits resistor 68 to turn on pull-up transistor 56 and pull the output node OUT up to a high level ($V_{OH}$).

Depending upon the output load, $V_{OH}$ will be between two and three diode voltage drops below the power-supply voltage. The two level-shifting diodes 60 and 62 between resistor 68 and pull-up transistor 56 are used to reduce $V_{OH}$. This, in combination with the constant-current action of constant-current/constant-voltage circuit 18A, prevents input transistors 30A–36A and 34B–36B, from entering saturation. Diodes 60 and 62 prevent the base voltage applied to pull-up transistor 56 from rising too high. The constant-current action sets a controllable voltage drop across resistor 38A. This prevents the common-collector node of transistors 30A–36A from dropping below the input high voltage ($V_{IH}$) applied to the base connection inputs of active input circuit 20A.

This circuit provides a great deal of design flexibility. The four inputs $A_1$–$A_4$, $B_1$–$B_4$ of active input circuits 20A and 20B can be expanded by simply adding more input transistors in parallel with transistors 30A–36A, 30B–36B. Furthermore, as shown by the dashed extension of common AND LINE 71 in FIG. 2, additional multi-input OR circuits can be added in parallel with OR circuits 12A and 12B as well as additional second-level arbitration resistor-transistor pairs corresponding to 38A and 40A.

In the product-of-sums circuit 10 shown in FIG. 2, a logical high output is provided when the first OR subfunction (circuit 12A) AND the second OR subfunction (circuit 12B) (AND any additional subfunctions connected in parallel with multi-input active circuits 12A and 12B) are all conducting to pull each of their combined-collector nodes down. Both circuits 12A and 12B must be activated to drop the voltage applied to common AND line 71 connected to output circuit 16 If either of the OR subfunctions (circuit 12A or circuit 12B) is not true, then the respective collector resistor, 38A or 38B, will pull the common AND line 71 high and drive the output (OUT) of output circuit 16 low. This topology permits ANDing together a practically unlimited number of OR subfunctions to yield product-of-sums gates.

A computer simulation has shown a logic circuit made in accordance with the present invention having four of four-input gate circuits like 12A has a logic swing of 2.1 Volts (47% of $V_{CC}$), noise margin high of 1.22 Volts (57% of the logic swing), noise margin low of 0.74 Volts (35% of the logic swing), and 590 picosecond delay with 10 mW power draw. Additional OR subfunction circuits do not slow down the operation of products-of-sums circuit 10 because each OR subfunction is isolated from the rest of the circuit by transistors, 40A, 40B, for example. This high-fanin compound functionality, with high speed throughput performance, surpasses prior-art designs. Because of dynamic performance degradation, a sixteen-input CMOS design may be impractical.

This circuit sacrifices some of the usual rail-to-rail logic swing of previous CNIL circuits in order to eliminate bipolar junction transistor saturation. In general, the circuit sacrifices from two to three diode voltage drops on the upper end of the logic swing ($V_{OHmax}$ approximately equals $V_{CC}$ minus 1.5 Volts) because of level-shift diodes 60 and 62. One diode drop is lost on the lower edge of the logic swing because diodes 64 and 66 clamp pull-down transistor 58. However, with a 4.5-Volt rail voltage, this design still yields a 2-Volt logic swing (47% of the power supply voltage).

The logic swing of the circuit is extended by adding series diodes 46 and 48. Diodes 46 and 48 permit the power supply voltage to be increased. The same 1.5-Volt and 0.7-Volt losses are incurred, but the logic swing and noise margins are increased with each additional diode added in series with diodes 46 and 48. As the range of the logic swing is expanded, the mid-point of the logic swing will increase. This requires that the turn-on voltage of the constant-current/constant-voltage circuit 18A, 18B be adjusted by adding additional diodes in series with diodes 24A, 24B.

If $V_{CC}$ is the power supply voltage, X is the number of diodes in the series of diodes 46 and 48, T is the number of diodes in series with diode 24A (or 24B), W is the number of diodes in the series of diodes 60 and 62, and assuming $V_{BE} \approx 0.75$ Volts; then the equations specifying the relationship between X, T, W and $V_{CC}$ for W=2 and $I_O*R_{38}=2V_{BE}$ are:

$$V_{CC}=(X+6) V_{BE}$$

$$V_{OHmax}=(X+4) V_{BE}$$

$$V_{OHmin}=(X+3) V_{BE}$$

$$V_{OL}=V_{BE}$$

$$L_{Smax}=(X+3) V_{BE}$$

$$T=(X+2)/2$$

When X=2, T=2 and $V_{CC}$=6.0 Volts, the logic swing is 3.6 Volts.

The use of transistors 40A, 40B rather than diodes in FIG. 2 improves speed by providing more drive current to the common AND line 71. Resistor 45 regulates the drive current to the base of transistor 50, ensuring uniform circuit performance independent of the number, or state, of the inputs. Since transistors 40A, 40B provide current gain to drive the common AND line 71, the values of resistors 38A and 38B may be increased, and correspondingly, the value of the current through the constant-current/constant-voltage circuit 18A, 18B may be reduced.

II. THE EMBODIMENT OF FIG. 3

FIG. 3 shows a four-input, compound-function logic circuit 72 in accordance with the present invention. Logic circuit 72 comprises OR circuits 74A and 74B, second-level arbitration circuit 76 and output circuit 78. OR circuit 74A includes constant-current circuit 80A, constant-voltage element 96A and active input circuit 82A. Similarly, OR circuit 74B includes constant-current circuit 80B, constant-voltage element 96B and active input circuit 82B.

A. OR CIRCUIT 74A

For simplicity, OR circuit 74A will be described in detail. OR circuit 74B operates in a similar manner.

Constant-current circuit 80A comprises an NPN bipolar junction transistor 84A, resistor 86A, diode 88A and diode 90A. The emitter of transistor 84A is connected to electrical ground. The base of transistor 84A is connected to a power-supply voltage through resistor 86A and diode 88A. The collector of transistor 84A is connected to a power-supply voltage through resistor 86A and diode 90A, and is also connected to active input circuit 82A.

Active input circuit 82A comprises NPN bipolar junction transistors 92A and 94A. The constant-voltage element comprises transistor 96A. The emitters of transistors 92A, 94A and 96A are connected to the collector of transistor 84A of circuit 80A. The base of transistor 96A is connected to voltage source 98A. The bases of transistors 92A and 94A are connected to input nodes $A_1$ and $A_2$ of circuit 72.

B. SECOND-LEVEL ARBITRATION CIRCUIT 76

Second-level arbitration circuit 76 comprises NPN bipolar junction transistors 100A and 100B and resistors 102A and 102B. The emitter of transistor 100A and the emitter of transistor 100B are connected together and are connected to node $N_1$. The base of transistor 100A is connected to the power-supply voltage through resistor 102A. The base of transistor 100A is connected to the collectors of transistors 92A and 94A. The collector of transistor 100A is connected to the power-supply voltage.

The base of transistor 100B is connected to the power-supply voltage through resistor 102B and connects to the collectors of transistors 92B and 94B. The collector of the transistor 100B is connected to a power-supply voltage.

C. OUTPUT CIRCUIT

Output circuit 78 comprises NPN pull-up transistor 104, NPN pull-down transistor 106, diodes 108, 110, 112, 114, 116, 118, 120 and 122, and resistors 124, 126 and 128.

The collector of pull-up transistor 104 is connected to a power-supply voltage. The emitter of pull-up transistor 104 is connected to the collector of pull-down transistor 106 and to output node OUT of logic circuit 72. The emitter of pull-down transistor 106 is connected to electrical ground. Diodes 120 and 122 clamp transistor 106 so that it cannot enter saturation. The base of pull-down transistor 106 is connected to node $N_1$ of second-level arbitration circuit 76 through diodes 116 and 118 and resistor 126. The base of pull-up transistor 104 is connected to node $N_2$ (and therefore OR circuits 74A and 74B) through diodes 112 and 114. Diodes 108 and 110 are connected in parallel with resistor 124 and connect the base of pull-up transistor 104 to the power supply voltage through diodes 112 and 114. In other embodiments the clamped pull-up circuit (108, 110, 124) can be replaced with a $V_{BE}$ multiplier circuit that comprises a single transistor with one resistor between the collector and base, and a second resistor between base and emitter; the clamping voltage of this circuit is determined by the ratio of the two resistors.

D. OPERATION

Logic circuit 72 of FIG. 3 provides a logical product-of-sums output OUT=$(A_1+A_2)(B_1+B_2)$. Pull-up resistor 124 has diodes 108 and 110 in parallel to limit the voltage swing at the collectors of 96A and 96B. Clamping the voltage swing at the collectors of transistors 96A and 96B prevents transistors 96A and 96B from entering saturation. Diodes 120 and 122 clamp pull-down transistor 106 and prevent it from entering saturation. Multi-input active circuits 74A and 74B generate mutually exclusive OR subfunction outputs. Mutually exclusive outputs prevent totempole current from flowing between simultaneously conducting pull-up transistor 104 and pull-down transistor 106.

The bases of transistors 96A and 96B are connected to a reference voltage 98A and 98B, which determines the logic-transition point of the input logic signal. The common emitter nodes of transistors 92A-96A and 92B-96B connect to constant-current circuits 80A and 80B, respectively, which regulate the current through the transistors.

To effect a logical high at output node OUT of circuit 72, the input node $A_1$ OR $A_2$ AND input node $B_1$ OR $B_2$ must be high. Current from the constant-current circuit (80A and 80B) is directed to the left branch of both multi-input circuits 74A and 74B. With both transistors 96A and 96B off, pull-up resistor 124 is able to pull up the signal path (node $N_2$) to turn on pull-up transistor 104 and provide a logical high output at the emitter of pull-up transistor 104.

When one or both of the OR subfunctions of circuits 74A and 74B are NOT true, the current drawn by constant-current circuits 80A or 80B switches to the right branch through transistors 96A and/or 96B, which allows transistors 100A and/or 100B to pull up the signal path (node $N_1$) to turn on transistor 106, which provides a logical low output. With at least one transistor 96A or 96B turned on, the signal path (node $N_2$) to pull-up transistor 104 is pulled down and the pull-up circuit is disabled, which prevents totem pole current from flowing.

The left and right branches of OR circuits 74A and 74B can be individually cross-coupled, at the black dots, to yield the logical complement of the 0R circuit's subfunction. This feature greatly increases logic functionally.

Logic circuit 72 of FIG. 3 provides (a) a power-saving push-pull output circuit that does not saturate, (b) large logic swings, (c) large noise margins and (d) improved logic functionality. Additional subfunction circuits, such as OR circuitry 74A and 74B, in addition to the corresponding second-level arbitration components 100 and 102, can be connected in parallel with circuits 72A and 72B as indicated by the dashed connections extending to the left from nodes $N_1$ and $N_2$. Emitter-follower transistors 1OOA and 100B may be replaced by isolation diodes. However, transistors 100A and 100B provide current gain so that the nominal power consumption of each OR circuit 74A and 74B can be reduced without compromising the signal drive to pull-down transistor 106. The control signal sent to pull-up transistor 104 can be adjusted by changing the total number of diodes in series with diodes 112 and 114. The control signal applied to pull-down transistor 106 is adjustable by changing the total number of diodes in series with diodes 116 and 118. These diodes provide designable logic swings and noise margins. The clamp formed by diodes 120 and 122 on pull-down transistor 106 prevent the pull-down transistor from entering saturation.

III. THE EMBODIMENT OF FIG. 4

Figure 4:
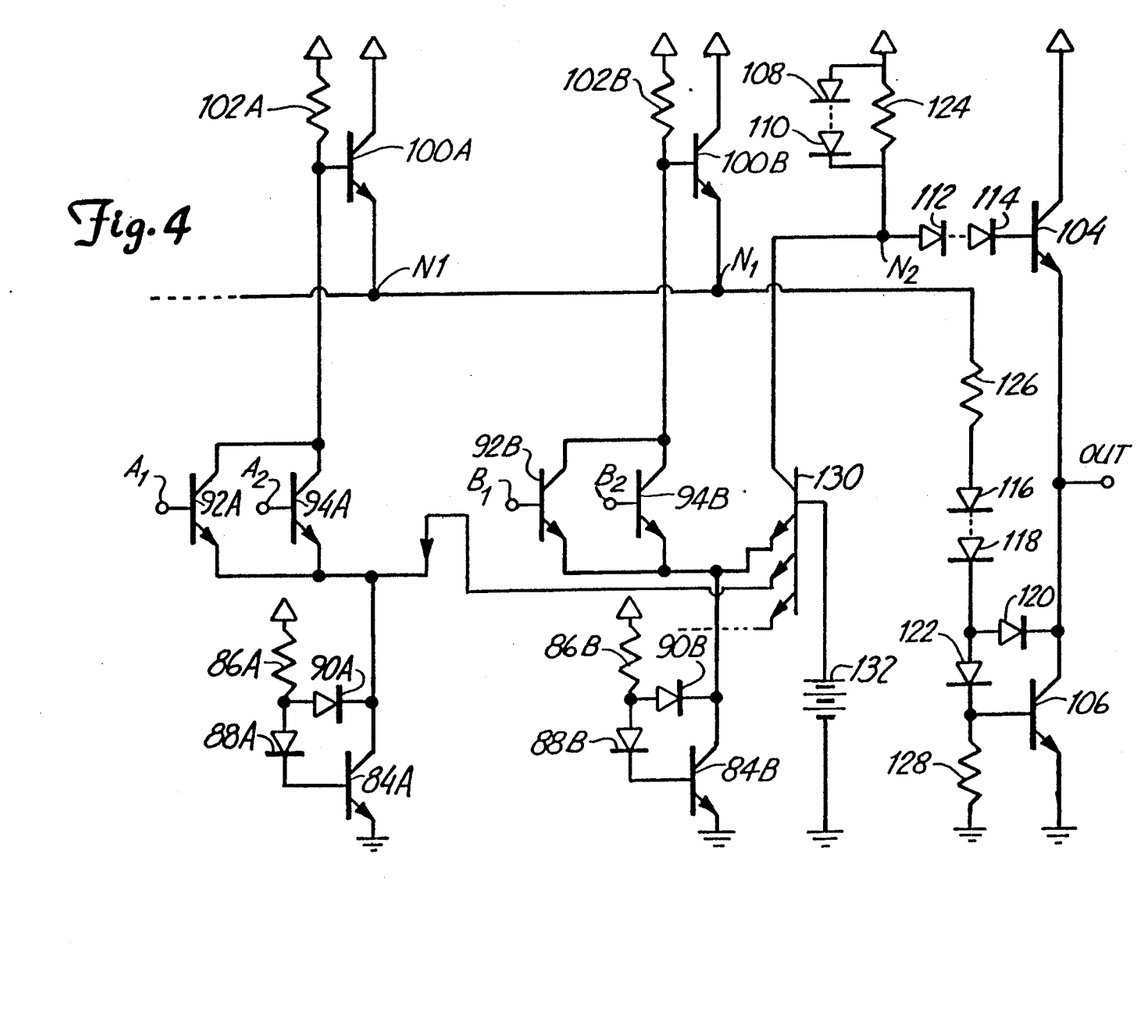
FIG. 4 is an electrical schematic diagram showing another embodiment of the present invention.
Figure 9:
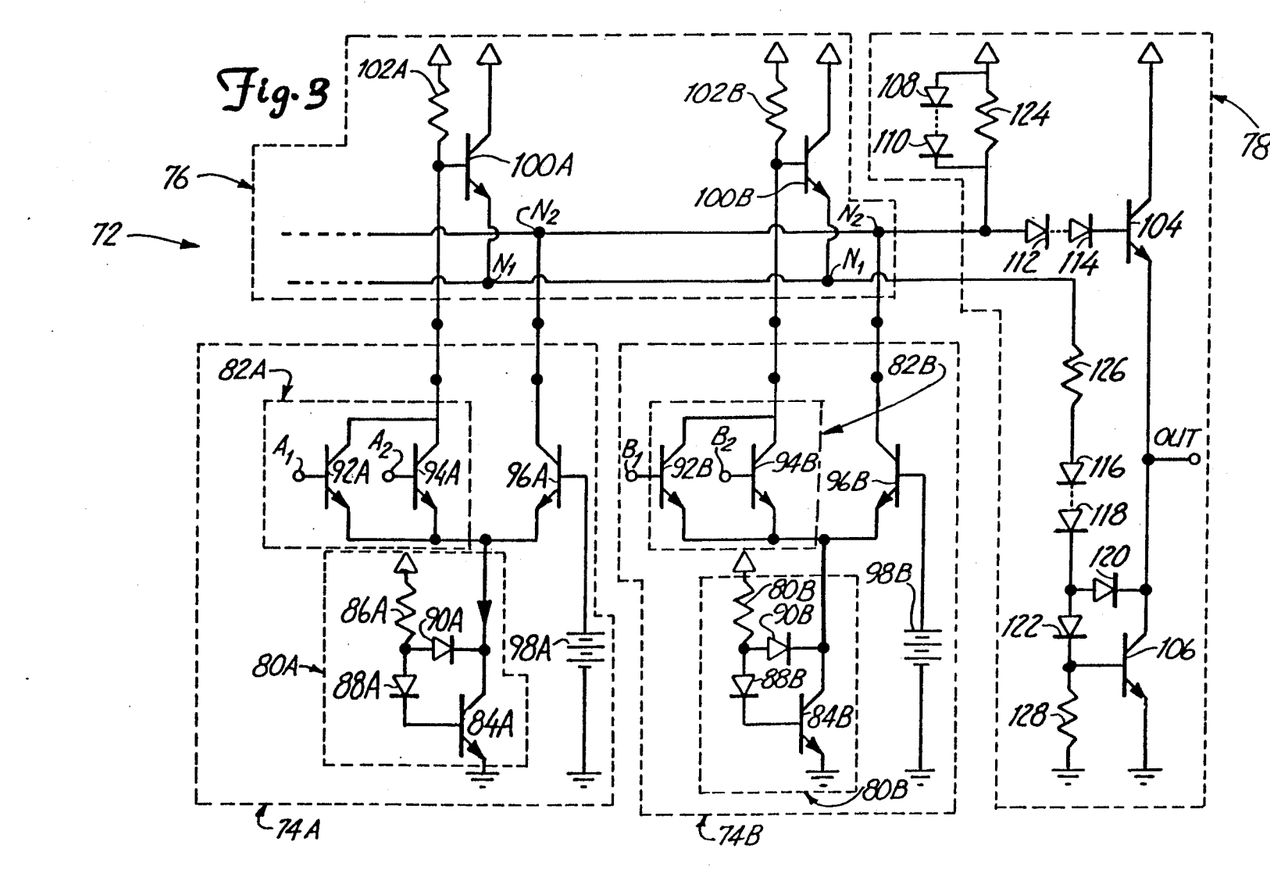

FIG. 4 shows another embodiment of the present invention. FIG. 4 is similar to the circuit of FIG. 3. and uses similar reference numerals to designate similar elements. FIG. 4 includes a multi-emitter NPN bipolar reference transistor 130 as a constant-voltage element. One emitter of multi-emitter transistor 130 is connected to the emitters of transistors 92A, 94A, and another emitter of transistor 130 is connected to the emitters of transistors 92B, 94B. The base of multi-emitter transistor 130 is connected to a voltage reference 132. The collector of multi-emitter transistor 130 connects to node $N_2$ (and through diodes 112 and 114 to the base of pull-up transistor 104).

The circuit of FIG. 4 reduces the number of transistors by merging transistors 96A and 96B shown in FIG. 3 into a single transistor 130. This eliminates redundant voltage sources 98A and 98B. The circuit of FIG. 4 yields the same product-of-sums logical operation, but uses less circuitry.

IV. CONCLUSION

The present invention is a useful new combination of circuit design techniques that yields a novel family of digital logic gates delivering unprecedented levels of reliability, speed, and logic functionality. This is not a modified ECL or a bipolar version of CMOS. The input portion of the present invention uses novel configurations of circuits that independently regulate voltage and current levels thereby permitting the design of arbitrarily large noise margins and logic swings. The voltage and current regulating circuits are not strictly a series connection of circuit elements that regulate a signal flowing between the input node and the control electrode of a driver transistor. In response to a changing input signal, these circuits interact to define the logic-transition point where the constant-voltage portion of the circuit turns on. Following that, the constant-current portion of the circuit regulates the amount of current that the constant-voltage element will conduct. Again the constant-voltage portion of the circuit permits the input voltage to travel through a first voltage range to yield one noise margin for one logic level and the current regulation permits a second variable voltage drop to develop for the other noise margin. The control signal that is received by the driver transistors in the present invention is merely a function of the conduction state of these regulating elements. Specifically, it is this non-series connection between input and driver-control nodes that is a crux of this innovation, distinguishing it from the prior art CNIL. For example, in FIG. 2 the constant-voltage and constant-current functions are combined into the one subcircuit 18A. Note that the self-regulating conduction state of this subcircuit, which is determined by voltage at the input nodes, indirectly controls the pull-down driver 58 via the presence or absence of a regulated current through resistor 38A. This flexible circuit architecture is what allows this invention to implement the important product-of-sums logic function.

Logic functionality is dramatically improved in two ways. In the input portion of the gate (a first-level OR subfunction of the product-of-sums configuration), each logical input node is connected to the current and voltage regulating circuits by a single active device. Therefore, the fanin, and hence overall logic functionality of the gate, can be incrementally increased by the simple addition of another active input circuit. Logic functionality is further enhanced by logically ANDing together the separate OR-subfunctions to yield the advantageous two-level product-of-sums logic operation. In other logic families, including ECL, implementing a large product-of-sums logic function usually requires wiring together separate single-level OR and AND gates; each level incurs a propagation and interconnect delay. Since the present invention combines two levels of logic into a single gate delay, it increases speed, reduces power, saves area, and reduces interconnect routing——all in addition to boosting logic functionality. This advantage is of special interest to the logician since, as a basic foundation of boolean algebra reveals, given that the true and complement of the input terms are available, any boolean function can be expressed as a product-of-sums expression.

The non-saturating push-pull output stage adds significantly to the performance of the present invention. This novel output stage features active pull-up and pull-down devices that are driven by mutually exclusive control signals. As a result, the present invention is able to effect rapid and symmetric transitions of a heavily loaded output node——yielding a large fanout drive capacity. The mutually exclusive control signals intentionally prevent the pull-up and pull-down transistors from conducting simultaneously. This circumvents the wasteful totempole current that plagues CMOS, and uses current more efficiently than always-on pull-down current source found in ECL. This delivers more speed per milliwatt. Self-induced current-spiking noise on the power supply bus is also reduced. The mutually exclusive control signals can be generated by an inverter subcircuit (42) within the driver circuit that is controlled by a single-ended line coming from the AND (second-level) arbitration) subcircuit (14), or they may be generated directly by the AND (second-level arbitration) subcircuit (76). Note that these signals are derived as a logical function of the conduction state of the constant-voltage and constant-current circuit elements in the input subcircuits and are not merely conditioned signals that are passed on from the input to control nodes.

The prevention of BJT saturation in this driver circuit also enhances its performance. The pull-up transistor uses diodes, or a Vbe-multiplier circuit, to intentionally reduce the $V_{OH}$ level, which thereby prevents the input transistors from saturating. The pull-down circuit employs a novel application of a clamp circuit to prevent it from saturating. This circuit uses two diodes in a negative feedback configuration to prevent the forward biasing of the pull-down BJT's base-collector junction. These circuit techniques eliminate the serious speed penalties caused by saturation, and also prevent injecting dangerous substrate current with the parasitic substrate PNP.

The present invention is a new combination of circuit design concepts that yield substantial advances in the performance of digital logic gates used in computers and other digital systems. The performance benefits include the following: high-speed operation with low power consumption; increased fanin and fanout; compound logic functions that are arbitrated with only a single gate delay; and improved computing reliability because of the large logic swings and noise margins. The invention includes circuit design techniques that prevent transistor saturation which yield high speed logic operation and low power consumption. A non-saturating push-pull output stage delivers rapid and symmetric logic transitions even at a heavily loaded output node. Mutually exclusive control signals to the output stage substantially limit totempole currents. The invention allows parallel gating which increases the number of subfunctions applied to the second-level arbitration circuit. The subfunctions also employ transistors which do not enter saturation, which further increases operation speed. The invention provides near-ideal noise margins and large logic swings.

Although the present invention has been described with reference to preferred embodiments, workers skilled in the art will recognize that changes may be made in form and detail without departing from the spirit and scope of the invention.

What is claimed is:

1. A digital logic circuit comprising:
a first logical subfunction comprising:
a multi-input active circuit with a plurality of input nodes, the circuit having a non-conductive state when all of the plurality of input nodes are low and a conductive state when one of the input nodes is high;
a constant-voltage element connected to the multi-input active circuit, which has a non-conducting state and a conducting state and provides a generally constant voltage drop when in the conducting state, which determines a transition voltage at which an input of the multi-input active circuit causes the multi-input active circuit to change between the non-conductive and the conductive state;
a constant-current element connected to the multi-input active circuit to establish a constant current through the constant-voltage element when the constant-voltage element is in the conductive state, wherein a voltage at any of the plurality of inputs to the multi-input active circuit may be greater than the transition voltage;
a second-level arbitration circuit connected to the first logical subfunction for producing mutually exclusive pull-up and pull-down control signals as a function of the multi-input active circuit; and
an output stage connected to the second-level arbitration circuit having a pull-up driver responsive to the pull-up control signal and a pull-down driver responsive to the pull-down control signal.

2. The digital logic circuit of claim 1 including a second logical subfunction circuit similar to the first logical subfunction circuit connected to the second-level arbitration circuit.

3. The digital logic circuit of claim 1 wherein the constant-voltage circuit and the constant-current circuit together comprise:
a transistor having a base, an emitter and a collector, the collector connected to the multi-input active circuit and the emitter connected to electrical ground;
a first diode connected in a forward direction from a first node to the collector of the transistor; and
a second diode connected in a forward direction from the first node to the base of the transistor.

4. The digital logic circuit of claim 1 wherein the multi-input active circuit comprises a plurality of transistors connected in parallel, each of the plurality of transistors having a collector, a base and a emitter wherein the collectors of the plurality of transistors are connected together and the emitters of the plurality of transistors are connected together and each base in the plurality of transistors comprises one of the plurality of input nodes to the multi-input active circuit.

5. The digital logic circuit of claim 1 wherein the second-level arbitration circuit includes a transistor having a collector, a base and a emitter, a first diode connected in a forward direction from a first node to the collector of the transistor, a second diode connected in a forward direction from the first node to the base of the transistor, the first node operably coupled to the multi-input active circuit, wherein the collector of the transistor provides the pull-up control signal and the emitter of the transistor provides the pull-down control signal.

6. The digital logic circuit of claim 5 including at least one diode connected to the first node for coupling to the multi-input active circuit.

7. The digital logic circuit of claim 1 wherein the pull-down driver of the output stage comprises a transistor including a collector, a base and an emitter and the output stage includes a first diode connected in a forward direction between a first node and the collector of the transistor and a second diode connected between the first node and the base of the transistor, wherein the output stage includes an output node at the collector of the transistor.

8. The digital logic circuit of claim 1 wherein the pull-up driver of the output stage comprises a transistor having a collector, a base and the emitter and the base of the transistor is coupled to the second-level arbitration circuit through at least one diode, and the emitter of the transistor is connected to an output node for the output stage.

9. The digital logic circuit of claim 1 wherein the second-level arbitration circuit includes a multi-emitter transistor having a collector, a base and a plurality of emitters connected to each multi-input active circuit, wherein the collector of the multi-emitter transistor provides one output of a mutually exclusive complementary output in response to the output of the multi-input active circuit and the collector of the multi-emitter transistor is connected to the pull-up driver of the output stage.

10. A digital logic circuit comprising:
a first gate having a plurality of inputs for receiving input signals and an output for providing an output signal, the output signal representative of a function of the relationship between the input signals and a transition voltage, including:
a constant-voltage element, connected to the first gate, which determines the transition voltage of the first gate; and
a constant-current element, electrically connected to the constant-voltage source for allowing the input voltage to exceed the transition voltage;
a second gate connected to the first gate for providing a first and a second mutually exclusive output signals; and
a push-pull driver connected to the second gate for receiving the first and the second mutually exclusive output signals and providing a logic circuit output signal.

11. A logic circuit comprising:
a plurality of input transistors having their emitters connected together at a first node, their collectors connected together at a second node and having their bases connected to input nodes;
a current source transistor having a collector connected to the first node of the input transistors, an emitter connected to electrical ground, and a base;
a clamping circuit for preventing the current source transistor from entering saturation comprising:
a first diode having an anode connected to a third node and a cathode connected to the collector of the current source transistor;
a second diode having an anode connected to the third node and a cathode connected to the base of the current source transistor;

a second-level arbitration circuit connected to the plurality of input transistors for producing mutually exclusive pull-up and pull-down signals representative of a function of voltages at the input nodes;
a push-pull driver connected to the input arbitration circuit for receiving the mutually exclusive pull-up and pull-down signals and producing a digital output signal.

12. The logic circuit of claim 11 wherein the push-pull driver comprises a pull-up transistor and a pull-down transistor.

13. The logic circuit of claim 12 wherein the input arbitration circuit includes a multi-emitter transistor having a collector, a base and a plurality of emitters connected to the plurality of input transistors, wherein the collector of the multi-emitter transistor provides one output of a mutually exclusive complementary output in response to a signal from the plurality of input transistors and the collector of the multi-emitter transistor is connected to the pull-up transistor of the push-pull driver.

14. The logic circuit of claim 12 wherein the push-pull drive further includes means for preventing the pull-down transistor from entering saturation.

15. A logic circuit comprising:
a first logic subfunction circuit comprising:
a plurality of input transistors having their emitters connected together at a first node, their collectors connected together at a second node and having their bases connected to input nodes, the plurality of input transistors having conducting and non-conducting states as a function of voltages at the input nodes;
means connected to the emitters of the plurality of transistors for setting an input transition voltage at the input nodes at which the plurality of input transistors switch between the conducting and the non-conducting states;
means connected to the emitters of the plurality of input transistors for setting current through the transistors when the transistors are in the conducting state;
an output node at the collectors of the plurality of input transistors which provides an intermediary output signal which is a function of the states of the plurality of input transistors;
a second logic subfunction circuit comprising:
a plurality of input transistors having their emitters connected together at a first node, their collectors connected together at a second node and having their bases connected to input nodes, the plurality of input transistors having conducting and non-conducting states as a function of voltages at the input nodes;
means connected to the emitters of the plurality of transistors for setting an input transition voltage at the input nodes at which the plurality of input transistors switch between the conducting and the non-conducting states;
means connected to the emitters of the plurality of input transistors for setting current through the transistors when the transistors are in the conducting state;
an output node at the collectors of the plurality of input transistors which is a function of the states of the plurality of input transistors;

a second-level arbitration circuit connected to the output nodes of the first and second logic subfunction circuits for accepting the intermediary output signals in parallel and producing an arbitration signal on a common signal line, wherein the arbitration signal is a function of the intermediary output signals; and an output driver connected to the common signal line which provides an output signal at an output node which is a function of the arbitration signal.

16. The logic circuit of claim 15 wherein the means for setting current comprises:
- a transistor having a collector connected to emitters of the plurality of input transistors, an emitter connected to electrical ground, and a base;
- a first diode having an anode connected to a first node and a cathode connected to the collector of the transistor; and
- a second diode having an anode connected to the first node and a cathode connected to the base of the transistor.

17. The logic circuit of claim 15 wherein the output driver comprises a pull-up transistor and a pull-down transistor.

18. The logic circuit of claim 17 wherein the second-level arbitration circuit includes a multi-emitter transistor having a collector, a base and a plurality of emitters connected to each of the plurality of input transistors wherein the collector of the multi-emitter transistor provides one output of a mutually exclusive complementary output in response to the state of the plurality of input transistors and the collector of the multi-emitter transistor is connected to the pull-up transistor of the output stage.

19. The logic circuit of claim 17 wherein the output driver further includes means for preventing the pull-down transistor from entering saturation.

* * * * *